United States Patent
Edwards et al.

(10) Patent No.: US 7,835,195 B2
(45) Date of Patent: Nov. 16, 2010

(54) STORAGE DATA UNIT USING HOT CARRIER STRESSING

(75) Inventors: Martin John Edwards, West Sussex (GB); John Richard Ayres, Surrey (GB); Nigel David Young, Surrey (GB)

(73) Assignee: TPO Displays Corp., Miao-Li Country (TW)

( * ) Notice: Subject to any disclaimer, the term of this patent is extended or adjusted under 35 U.S.C. 154(b) by 152 days.

(21) Appl. No.: 12/331,560

(22) Filed: Dec. 10, 2008

(65) Prior Publication Data

US 2009/0161450 A1    Jun. 25, 2009

Related U.S. Application Data

(60) Provisional application No. 61/016,573, filed on Dec. 25, 2007.

(30) Foreign Application Priority Data

Mar. 27, 2008   (EP)   ................... 08103029

(51) Int. Cl.
*G11C 7/00*   (2006.01)
(52) U.S. Cl. ................... 365/189.011; 365/184
(58) Field of Classification Search .................. 365/184
See application file for complete search history.

(56) References Cited

U.S. PATENT DOCUMENTS

| | | | | |
|---|---|---|---|---|
| 4,843,442 A | * | 6/1989 | Boudou et al. | 365/184 |
| 6,018,475 A | | 1/2000 | Papadas et al. | |
| 6,859,390 B2 | * | 2/2005 | Pashmakov | 365/163 |
| 7,764,541 B2 | * | 7/2010 | Kohler et al. | 365/184 |

FOREIGN PATENT DOCUMENTS

| | | |
|---|---|---|
| JP | 09223750 | 8/1997 |
| WO | 2005081258 | 9/2005 |

OTHER PUBLICATIONS

Extended EP Search Report issued Feb. 10, 2009.
English Abstract of JP09223750.

* cited by examiner

*Primary Examiner*—Tan T. Nguyen
(74) *Attorney, Agent, or Firm*—Thomas, Kayden, Horstemeyer & Risley

(57) ABSTRACT

The memory comprises at least two data storage units using hot carrier stressing damage to store data. Each data storage unit comprises the first terminal, the second terminal and a third terminal. When the first cross voltage between the second and third terminals is higher than the first threshold voltage and the second cross voltage between the first and third terminals is higher than the second threshold voltage, the data storage unit is in the first writing operation.

18 Claims, 12 Drawing Sheets

STORAGE DATA UNIT USING HOT CARRIER STRESSING

BACKGROUND OF THE INVENTION

1. Field of the Invention

The invention relates to data storage units of a memory array, and in particular relates to the data storage units using hot carrier stressing to store data.

2. Description of the Related Art

In active matrix displays, there is a need to store data relating to the operation of a display, for example information about the drive voltages required by the display or characteristics of the liquid crystal material. If the active matrix display can store data without extra memory devices, the cost can be reduced.

BRIEF SUMMARY OF THE INVENTION

A detailed description is given in the following embodiments with reference to the accompanying drawings.

An embodiment of a memory array is provided. The memory array comprises at least two data storage units using hot carrier stressing damage to store data. The data storage units comprise a first terminal, a second terminal and a third terminal. When a first cross voltage between the second and third terminals is close to or exceeds a first threshold voltage and a second cross voltage between the first and third terminals exceeds a second threshold voltage, the data storage unit is in a first writing operation.

Another embodiment of a display system is provided. The display system comprises a memory array. The memory comprises at least two data storage units using hot carrier stressing damage to store data. The data storage units comprise a first terminal, a second terminal and a third terminal. When a first cross voltage between the second and third terminals is close to or exceeds a first threshold voltage and a second cross voltage between the first and third terminals exceeds a second threshold voltage, the data storage unit is in a first writing operation.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
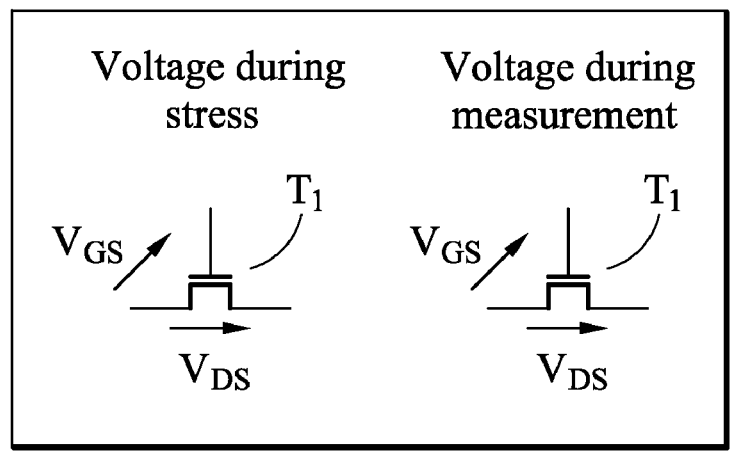
FIG. 1 is a transistor during stressing and measurement according to an embodiment of the invention.

FIG. 1 is a transistor T1 during stressing (writing operation) and measurement (first reading operation) according to an embodiment of the invention. Transistor T1 is a MOS transistor which can be subject to hot carrier stressing, in particular a low temperature polycrystalline silicon (LTPS) thin film transistor, is used as a means for storing digital information in a non-volatile form. During a writing operation (hot carrier stressing), cross voltage (gate source voltage) $V_{GS}$ is close to or exceeds the first threshold voltage and cross voltage (drain source voltage) $V_{DS}$ exceeds the second threshold voltage. For example, cross voltage $V_{GS}$ is 2.5V and cross voltage $V_{DS}$ is 16V, and transistor T1 is in a writing operation. During a reading operation, cross voltage $V_{GS}$ exceeds the first threshold voltage. For example, cross voltage $V_{GS}$ of transistor T1 can be 3V or 5V, and cross voltage $V_{DS}$ of transistor T1 can be from 0V to 5V based on a read circuit operation.

Figure 2:
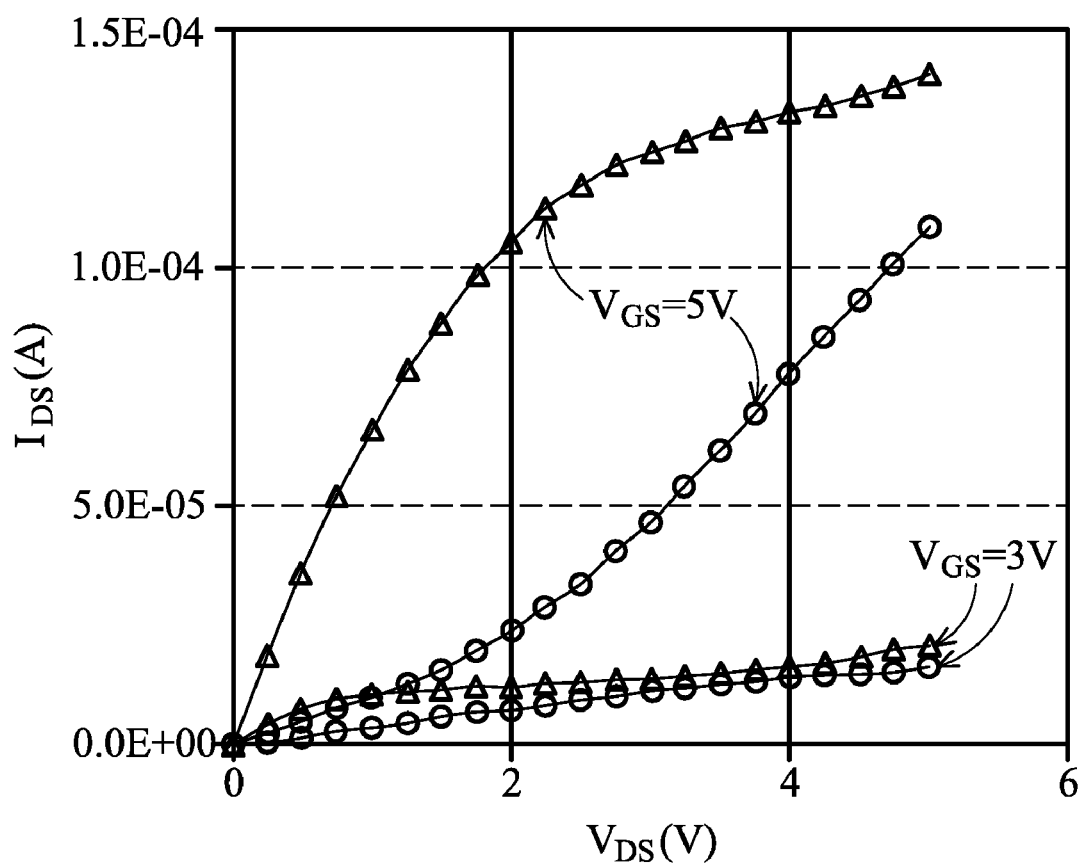
FIG. 2 is a relation diagram of drain source voltage and drain current of transistor in the first reading operation according to another embodiment of the invention.

FIG. 2 is a relation diagram of cross voltage $V_{DS}$ and drain current $I_{DS}$ of transistor T1 in the first reading operation according to another embodiment of the invention. Drain current $I_{DS}$ of transistor T1 before stressing is shown by the triangle marks and after stressing is shown by the circular marks. After stressing, drain current $I_{DS}$ is significantly reduced, particular at lower values of cross voltage (drain source voltage) $V_{DS}$.

Figure 3:
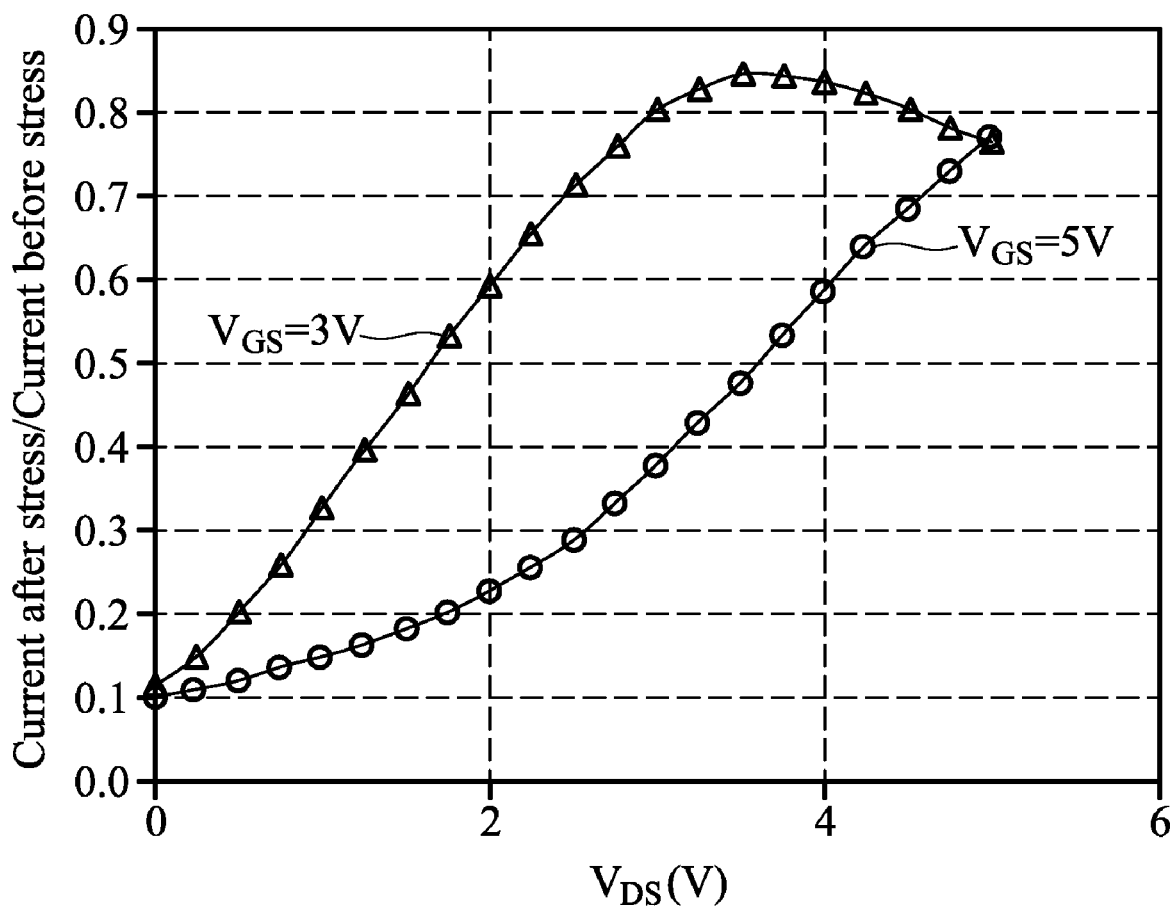
FIG. 3 is a relation diagram of a ratio of drain currents after stress over before stress in the first reading operation according to another embodiment of the invention.

FIG. 3 is a relation diagram of a ratio of drain currents $I_{DS}$ after stress over before stress in the first reading operation according to another embodiment of the invention. As shown in FIG. 3, the lowest ratio of drain current $I_{DS}$ after stressing over before stressing occurs at lower values of drain source voltage $V_{DS}$. When drain source voltage $V_{DS}$ increases, the change in current with stressing is significantly lower and the ratio of drain current $I_{DS}$ after stressing over before stressing is high. Thus, it is more difficult to detect whether transistor T1 has been stressed or not. It is easy to detect whether transistor T1 has been stressed or not at relatively low values of drain source voltage $V_{DS}$ and high values of gate source voltage $V_{GS}$, as shown in FIG. 3. It is necessary to compare the current passed through the memory transistors with some reference level in order to determine whether transistors have been stressed. This reference level can be preset or derived from transistors which are formed at the same time as the memory circuit and therefore have similar characteristic. Alternatively, each bit of data can be stored in a complementary form using two transistors in which case it is only necessary to compare the two transistors storing the data thus avoiding the need to generate a reference level.

Figure 4:
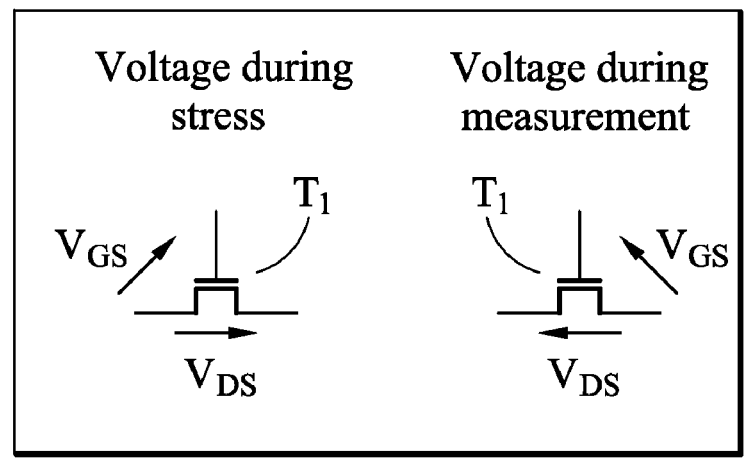
FIG. 4 is a transistor during stressing and reversing measurement according to another embodiment of the invention.
Figure 5:
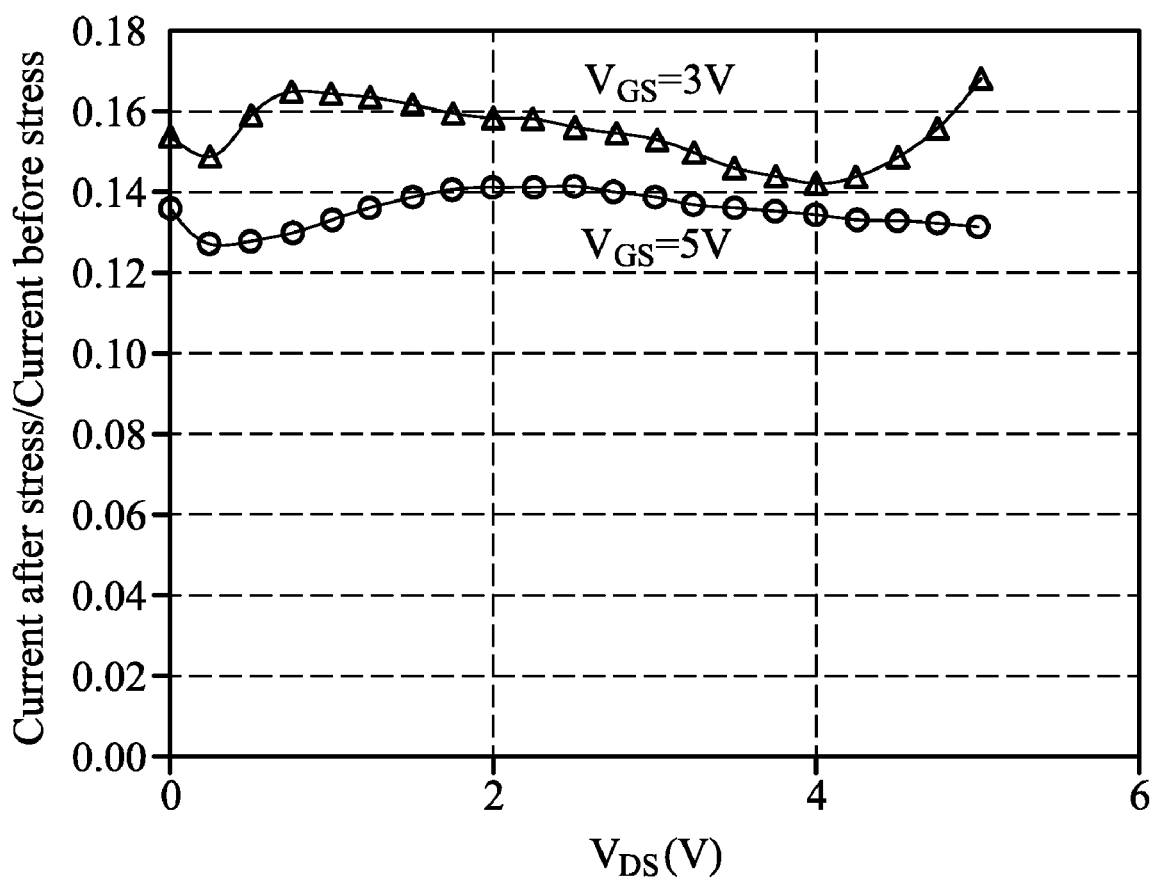
FIG. 5 is a relation diagram of a ratio of drain currents after stress over before stress in the second reading operation according to another embodiment of the invention.

FIG. 4 is transistor T1 during stressing (writing operation) and reversing measurement (second reading operation) according to another embodiment of the invention. The connection to the source/drain terminals of transistor T1 during the measurement of the current are reversed compared to transistor T1 during the stressing FIG. 5 is a relation diagram of a ratio of drain currents after stress over before stress in the second reading operation according to another embodiment of the invention. The hot carrier damage that occurs during stress tends to be localized at the drain end of transistor T1 (as defined by the applied voltage). If the connection to transistor T1 are reversed during measurement so that the damage region is located at the source end of the channel region (as defined by the applied voltage) then the effect of the stress on the measured current has a much lower dependence on the drain source voltage as indicated in FIG. 5. In addition, the current value is reduced over a large range of bias voltage compared to FIG. 3. With this modification to the writing and reading methodology, the value of drain source voltage $V_{DS}$ applied to transistor T1 during a reading operation is less critical.

Figure 6:
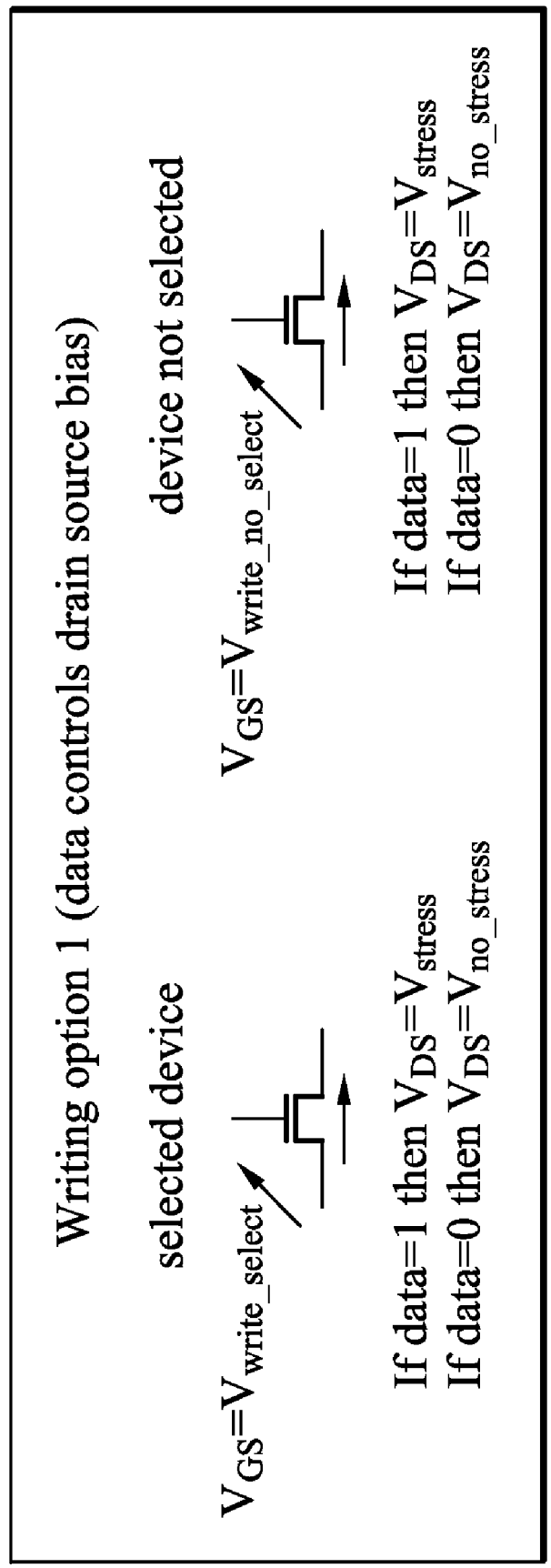
FIG. 6 shows the first writing option to write data into transistors according to another embodiment of the invention.

FIG. 6 shows the first writing option to write data into transistors according to another embodiment of the invention. The gate source voltage $V_{GS}$ is used to select rows or columns of transistors in a memory array and the drain source voltage $V_{DS}$ is used to determine which of the selected transistors is programmed with a data 1 (stressed) or a data o (unstressed).

Figure 7:
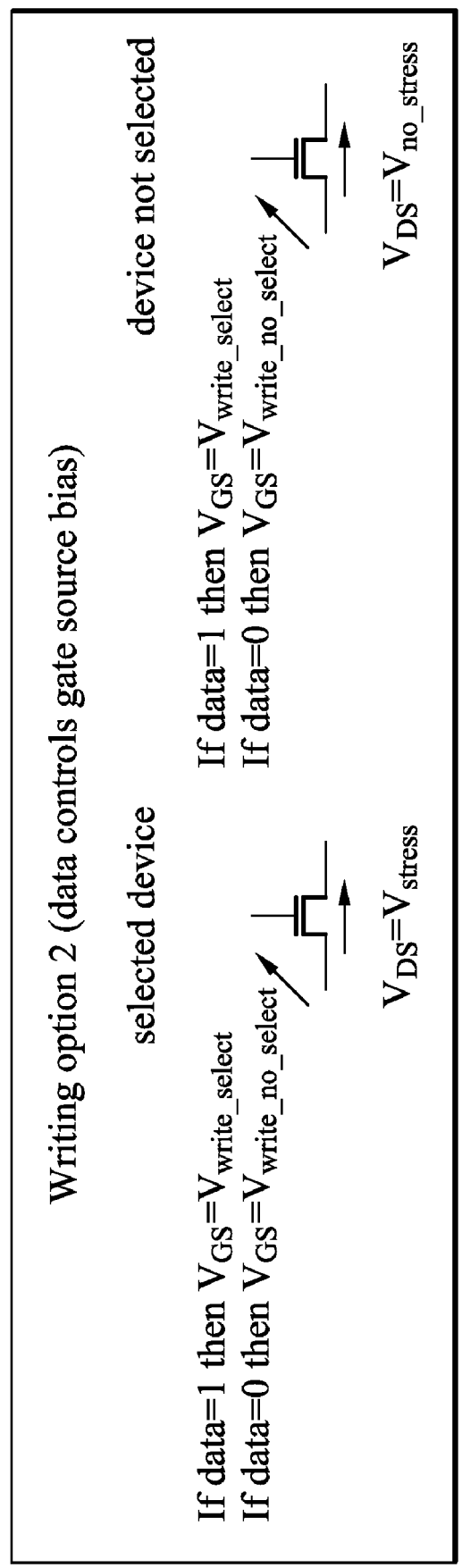
FIG. 7 shows the second writing option to write data into transistors according to another embodiment of the invention.

FIG. 7 shows the second writing option to write data into transistors according to another embodiment of the invention. The drain source voltage $V_{DS}$ is used to select rows or columns in a memory array and the gate source voltage $V_{GS}$ is used to determine which of the selected transistors is programmed with a data 1 (stressed) or a data o (unstressed).

Figure 8:
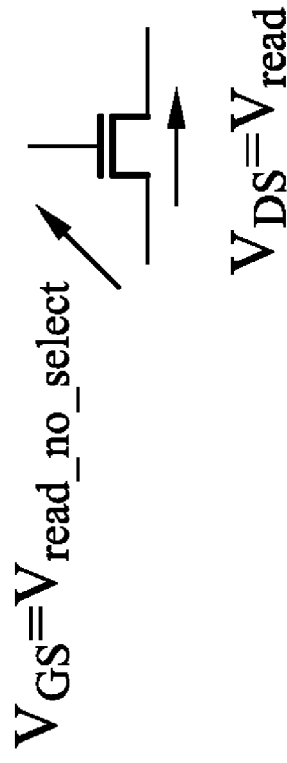
FIG. 8 shows the first reading operation to read data from transistors according to another embodiment of the invention.
Figure 8:
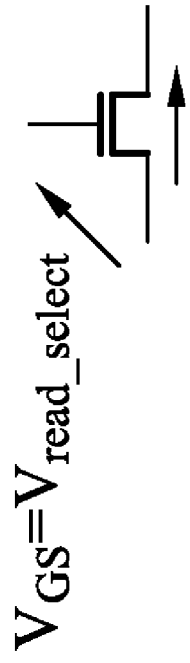

FIG. 8 shows the first reading operation to read data from transistors according to another embodiment of the invention. The drain/source connections of the transistor are the same during writing and reading.

Figure 9:
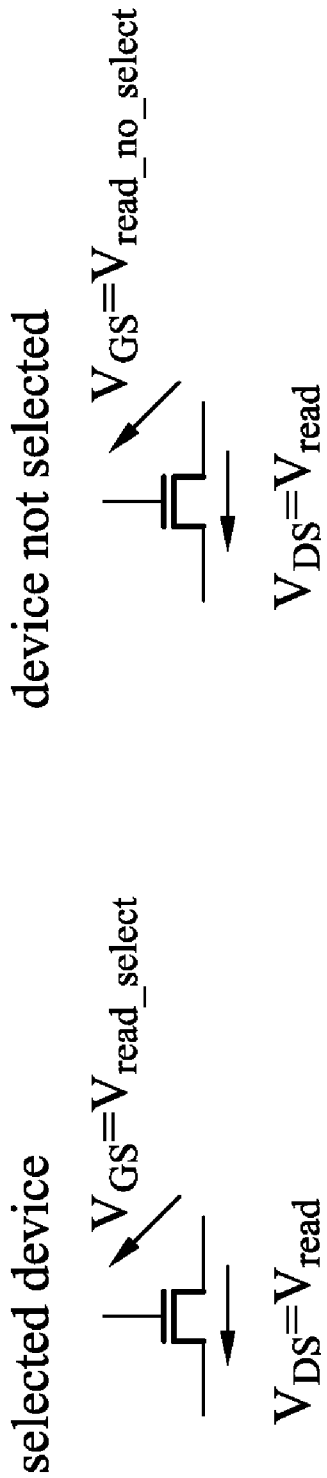
FIG. 9 shows the second reading operation to read data from transistors according to another embodiment of the invention.

FIG. 9 shows the second reading operation to read data from transistors according to another embodiment of the invention. The drain/source connections of the transistor during reading are reversed compared to during writing. The possible values of voltages used to write data to and read data from transistors are given in table 1.

TABLE 1

| | |
|---|---|
| $V_{write\_select}$ | $V_T$ (threshold voltage) |
| $V_{write\_no\_select}$ | 0 V |
| $V_{stress}$ | 16 V |
| $V_{no\_stress}$ | 0 V |
| $V_{read\_select}$ | 5 V |
| $V_{read\_no\_select}$ | 0 V |
| $V_{read}$ | 0-5 V (depending on read circuit operation) |

The damage caused by the hot carrier stressing tends to occur at the drain end of the channel of transistor where the drain terminal is the end of the channel which has a more positive voltage for an N channel transistor. This introduces asymmetry into the current voltage characteristics of the transistor. Thus, there are four possible states for a transistor. The first state is that a transistor has not been stressed. The second state is that the transistor has been stressed with the first of its source/drain terminals connected to a higher voltage and the second of its source/drain terminals connected to a lower voltage. The third state is that the transistor has been stressed with the first of its source/drain terminals connected to a lower voltage and the second of its source/drain terminals connected to a higher voltage. The fourth state is that the transistor has been stressed with the first of its source/drain terminals connected to a higher voltage and the second of its source/drain terminals connected to a lower voltage (first writing operation) and the transistor has also been stressed with the first of its source/drain terminals connected to a lower voltage and the second of its source/drain terminals connected to a higher voltage (second writing operation).

Current I1 is defined as a current that is passed through a transistor with the first of its source/drain terminals more positive than the second of its source/drain terminal. Current I2 is defined as a current that is passed through a transistor with the second of its source/drain terminals more positive than the first of its source/drain terminal. It is preferred that I1 and I2 are measured with the transistor operating in the saturation region. In the linear region the difference between I1 and I2 may be small. The first state is that current I1 and current I2 both are greater than reference current IR. The second state is that current I1 is significantly greater than current I2. The third state is that current I2 is significantly greater than current I1. The fourth state is that current I1 and current I2 are both less than reference current IR.

The first, second, third and fourth states can respectively correspond to data 00, data 01, data 10 and data 11 according to another embodiment of the invention. These four states can also be used to provide a limited re-writing capacity. For example, each data storage unit of the memory can be written with data on two occasions. In the first occasion of writing data, the first state can represent data 0 and the second state can represent data 1. In the second occasion of writing data, the first and second states represent data 0 and the third and fourth states represent data 1 according to another embodiment of the invention. It is also possible to only use the second and third states to store one bit of information in each transistor. The advantage of only using the second and third states is that no reference current is required. For example, if current I1 is greater than current I2, the stored bit is data 1, and if current I2 is greater than current I1, the stored data is data 0.

Figure 10:
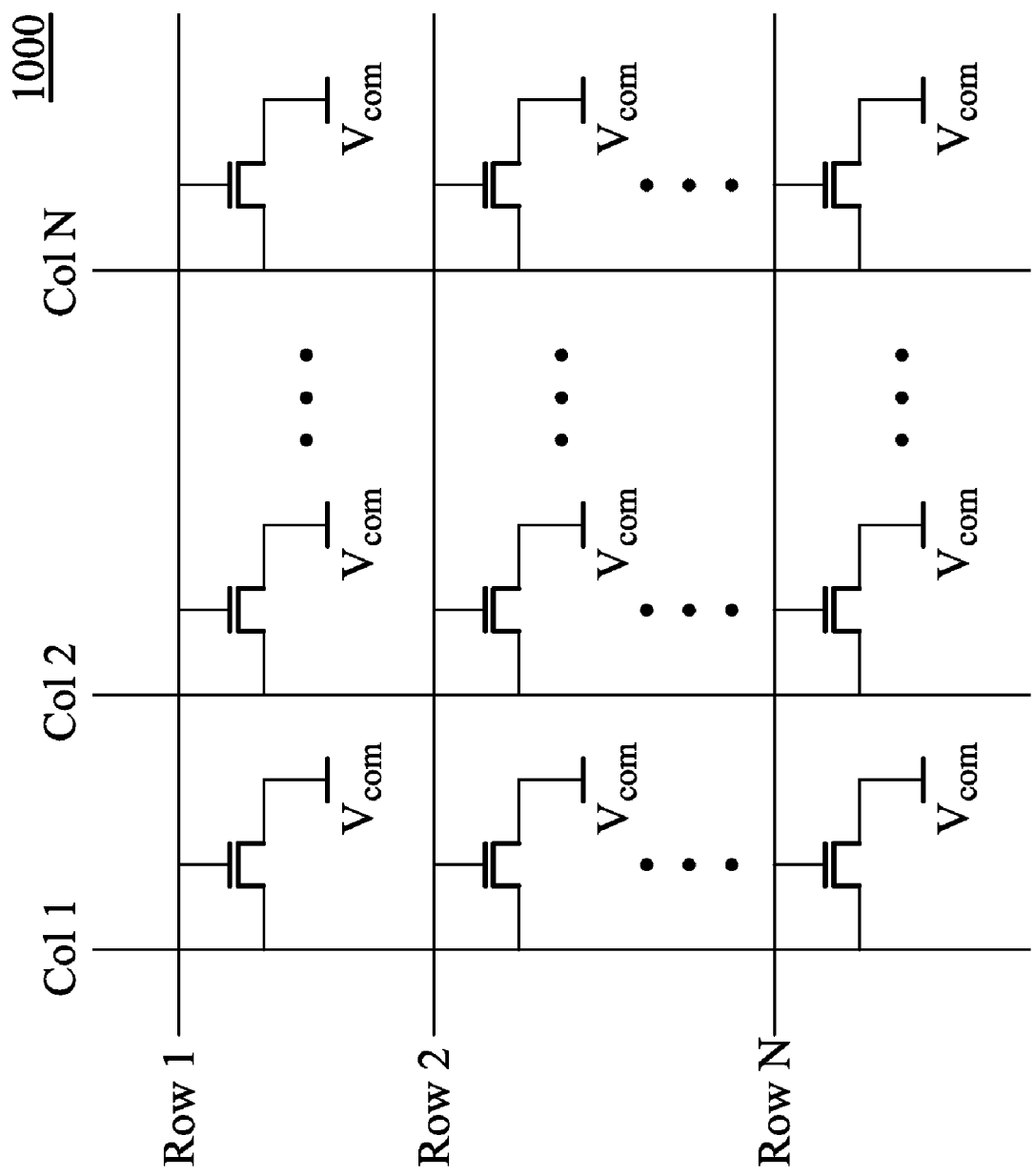
FIG. 10 is a memory array comprising data storage units using hot carrier stressing to store data according to another embodiment of the invention.

FIG. 10 is a memory array 1000 comprising data storage units using hot carrier stressing to store data according to another embodiment of the invention. Each transistors is formed at the cross point of a column line and a row line and is coupled to a column line, a row line and a common electrode Vcom. The memory comprises a plurality of columns (Col 1, Col 2, Col N) and a plurality of row lines (Row 1, Row 2, Row N).

Figure 11:
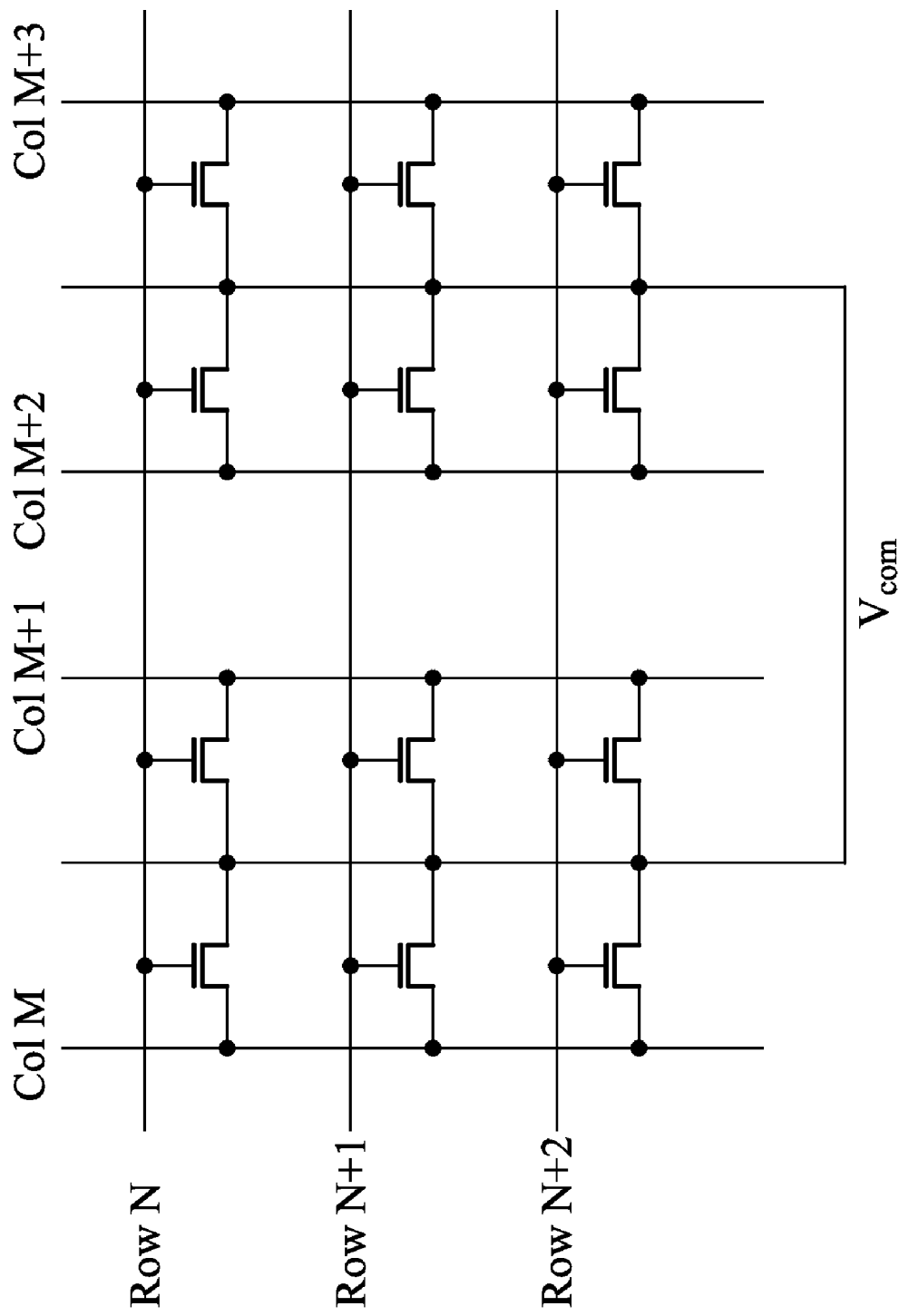
FIG. 11 is an actual layout of a memory array comprising data storage units using hot carrier stressing to store data according to another embodiment of the invention.

FIG. 11 is indicative of an actual layout of a memory array 1100 comprising data storage units using hot carrier stressing to store data according to another embodiment of the invention. Row lines N, N+1 and N+2 are formed on the first metal layer. Column lines Col M, Col M+1, Col M+2 and Col M+3 and common electrode Vcom are formed on the second metal layer. The transistors coupled to column lines Col M and Col M+1 share one common electrode line to connect to common electrode Vcom.

Figure 12:
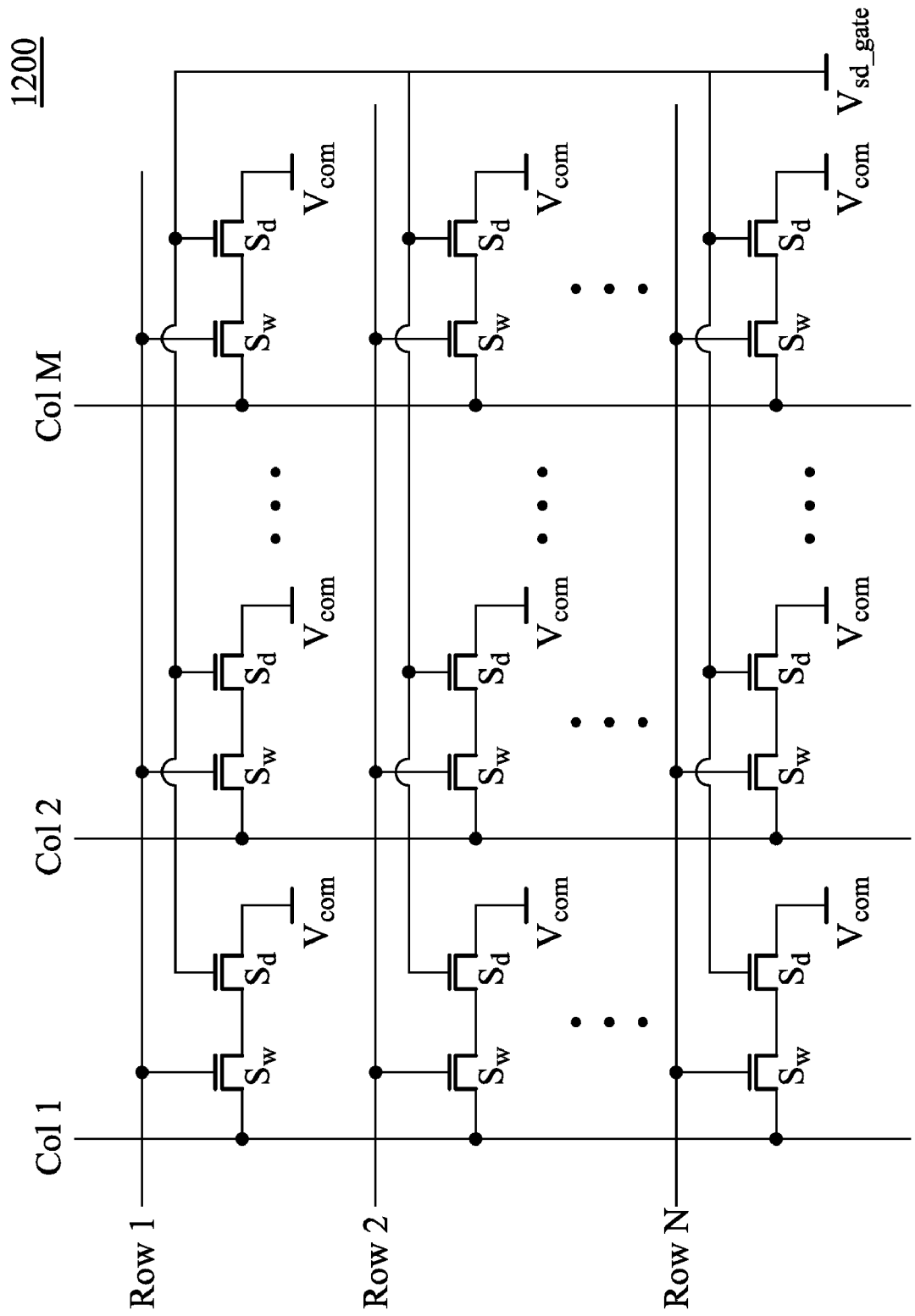
FIG. 12 is a memory array using hot carrier stressing to store data according to another embodiment of the invention.

FIG. 12 is a memory array 1200 using hot carrier stressing to store data according to another embodiment of the invention. The hot carrier stressing may cause a transistor to increase leakage current. If the leakage current is too large, it may reduce the ability to measure the current of an individual transistor within an array. A plurality of switch devices (switch transistor) Sw and data storage units (memory transistor) Sd form a matrix memory array 1200. Matrix memory array 1200 comprises a plurality of column lines Col 1, Col 2, Col M and a plurality of row lines Row 1, Row 2, Row N. Each switch device Sw is coupled to one column line, one row line and one corresponding data storage unit Sd. Each data storage unit Sd is coupled to one corresponding switch device Sw, a common gate electrode $V_{Sd\_gate}$ and common electrode Vcom.

Figure 13:
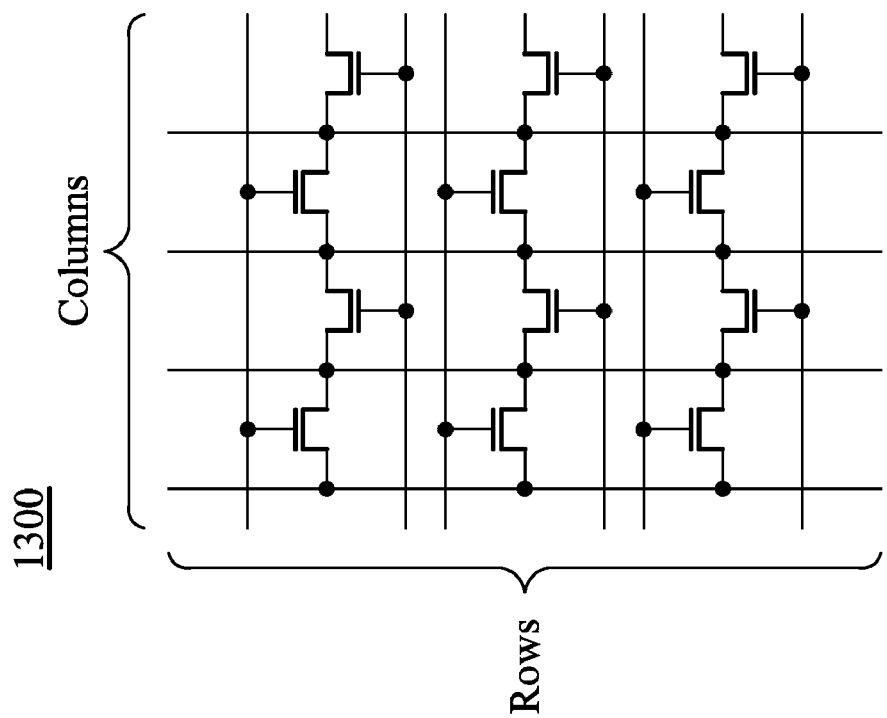
FIG. 13 is a memory array comprising data storage units using hot carrier stressing to store data according to another embodiment of the invention.

FIG. 13 is a memory array 1300 comprising data storage units using hot carrier stressing to store data according to another embodiment of the invention. Each data storage unit is coupled between two adjacent column lines. Memory array 1300 does not need a common electrode, but needs additional row lines. The gates of two data storage units at adjacent columns are coupled to alternative row lines. Writing and reading of data from a row of transistors needs to be performed in two sequential steps as only half of the transistors in a row can be addressed at one time.

Figure 14:
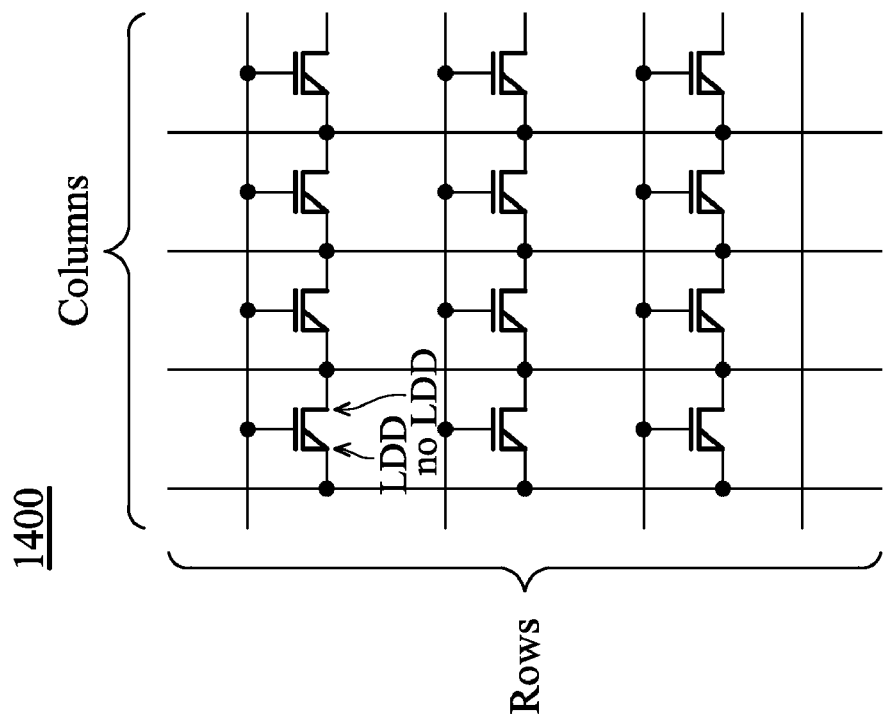
FIG. 14 is a memory array comprising data storage units using hot carrier stressing to store data according to another embodiment of the invention.

FIG. 14 is a memory array 1400 comprising data storage units using hot carrier stressing to store data according to another embodiment of the invention. Each data storage unit is a light doped drain transistor.

Figure 15:
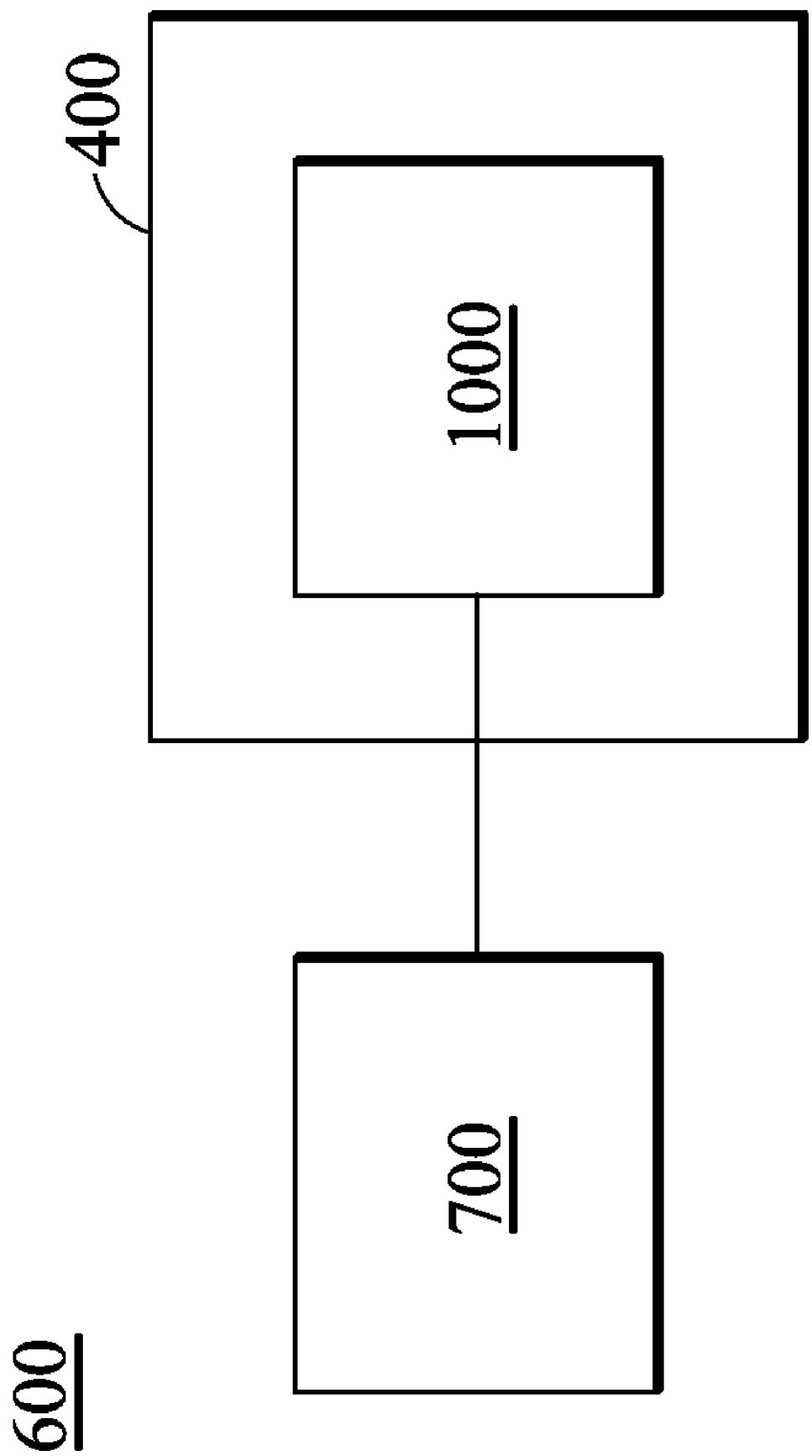
FIG. 15 schematically shows another embodiment of a system for displaying images.

FIG. 15 schematically shows another embodiment of a system for displaying images which, in this case, is implemented as display panel 400 or electronic device 600. As shown in FIG. 15, display panel 400 comprises memory array 1000 of FIG. 10. Display panel 400 can form a portion of a variety of electronic devices (in this case, electronic device 600). Generally, electronic device 600 can comprise display panel 400 and power supply 700. Memory array 1000 disposed on the baseboard of display panel 400 or other outside circuits can store some setting data or default data for the display panel 400. Further, power supply 700 is operatively coupled to display panel 400 and provides power to display panel 400. Electronic device 600 can be a mobile phone, digital camera, PDA (personal digital assistant), notebook computer, desktop computer, television, car display, global positioning system (GPS), avionics display or portable DVD player, for example.

While the invention has been described by way of example and in terms of preferred embodiment, it is to be understood that the invention is not limited to thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A memory array, comprising
   at least two data storage units using hot carrier stressing damage to store data;
   wherein the data storage unit comprises a first terminal, a second terminal and a third terminal, and when a first cross voltage between the second and third terminals is close to or exceeds a first threshold voltage and a second cross voltage between the first and third terminals exceeds a second threshold voltage, the data storage unit is in a first writing operation;
   wherein the first threshold voltage and the second threshold voltage are used for generating hot carrier stressing; and
   wherein when a first reversed cross voltage between the first and second terminals is close to or exceeds the first threshold voltage and the second cross voltage between the first and third terminals exceeds the second threshold voltage, the data storage unit is in a second writing operation.

2. The memory array as claimed in claim 1, wherein when the data storage unit is in a first reading operation, the first cross voltage of the data storage unit is a first voltage and a first current through from the third to the first terminals of the data is detected.

3. The memory array as claimed in claim 2, wherein the first current from the third terminal to the first terminal is divided by an unstressed current to determine whether the data storage unit has been stressed or not.

4. The memory array as claimed in claim 1, wherein when the data storage unit is in a second reading operation, a first reversed cross voltage between the first and second terminals is a second voltage and a second current through from the first to the third terminals of the data is detected.

5. The memory array as claimed in claim 4, wherein the second current from the first terminal to the third terminal is divided by an unstressed current to determine whether the data storage unit has been stressed or not.

6. The memory array as claimed in claim 1, wherein when the data storage unit stores two bits, comparing a first current from the third terminal to the first terminal to a second current from the first terminal to the third terminal or comparing the first current and the second current to a reference current to determine a storing state of the data storage unit.

7. The memory array as claimed in claim 1, wherein when the data storage unit stores two bits, the data storage unit is processed through the first writing operation and the second writing operation.

8. The memory array as claimed in claim 1, wherein the data storage units form a matrix memory array, the matrix memory array comprises a plurality of column lines and a plurality of row lines, and each data storage unit is coupled to the column line, the row line and a common electrode.

9. The memory array as claimed in claim 8, wherein the row lines are formed on a first metal layer, the column lines and the common electrode are formed on a second metal layer and the adjacent data storage units share one common electrode line to connect the common electrode.

10. The memory array as claimed in claim 1, wherein the data storage units and a plurality of switch devices forms a matrix memory array, the matrix memory array comprises a plurality of column lines and a plurality of row lines, each switch device is coupled to the corresponding column line, the corresponding row line and the corresponding data storage unit, and each data storage unit is coupled to the corresponding switch device and a common electrode.

11. The memory array as claimed in claim 1, wherein the data storage units forms a matrix memory array, the matrix memory array comprises a plurality of column lines and a plurality of row lines, and each data storage unit is coupled between two adjacent column lines and gates of two data storage units at adjacent columns are coupled to the alternative row lines.

12. The memory array as claimed in claim 1, wherein the data storage units are light doped drain transistors.

13. A display system, comprising:
    a memory array, comprising:
    at least two data storage units using hot carrier stressing damage to store data;
    wherein the data storage unit comprises a first terminal, a second terminal and a third terminal, and when a first cross voltage between the second and third terminals is close to or exceeds a first threshold voltage and a second cross voltage between the first and third terminals exceeds a second threshold voltage, the data storage unit is in a first writing operation;

wherein the first threshold voltage and the second threshold voltage are used for generating hot carrier stressing;

wherein when a first reversed cross voltage between the first and second terminals is close to or exceeds the first threshold voltage and the second cross voltage between the first and third terminals exceeds the second threshold voltage, the data storage unit is in a second writing operation;

wherein when the data storage unit is in a first reading operation, the first cross voltage of the data storage unit is a first voltage and a first current from the third to the first terminals of the data is detected; and wherein when the data storage unit is in a second reading operation, a first reversed cross voltage between the first and second terminals is a second voltage and a second current from the first to the third terminals of the data is detected.

14. The display system as claimed in claim 13, wherein when the data storage unit stores two bits, comparing a first current from the third terminal to the first terminal to a second current from the first terminal to the third terminal or comparing the first current and the second current to a reference current to determine a storing state of the data storage unit.

15. The display system as claimed in claim 13, wherein the first current from the third terminal to the first terminal is divided by an unstressed current to determine whether the data storage unit is stored data or not, and wherein the second current from the first terminal to the third terminal is divided by an unstressed current to determine whether the data storage unit is stored data or not.

16. The display system as claimed in claim 13, further comprising a display panel, wherein the memory array forms a portion of the display panel.

17. The display system as claimed in claim 13, further comprising an electronic device, wherein the electronic device comprises:
a display panel; and
a power supply coupled to and providing power to the display panel.

18. The display system as claimed in claim 13, wherein the display system is embodied in an electronic device, wherein the electronic device is a mobile phone, digital camera, PDA, notebook computer, desktop computer, television, car display, global positioning system (GPS), avionics display or portable DVD player.

* * * * *